United States Patent [19]
Fang

[11] Patent Number: 5,236,552
[45] Date of Patent: Aug. 17, 1993

[54] PHOTORESIST STRIPPING METHOD

[75] Inventor: Treliant Fang, Lawrenceville, N.J.

[73] Assignee: AT&T Bell Laboratories, Murray Hill, N.J.

[21] Appl. No.: 874,472

[22] Filed: Apr. 13, 1992

[51] Int. Cl.⁵ .................. B44C 1/22; B29C 37/00; C23F 1/00
[52] U.S. Cl. .................. 156/659.1; 156/655; 156/656; 156/668; 156/904; 252/79.1; 430/329
[58] Field of Search ............ 156/655, 656, 659.1, 156/668, 904; 252/79.1, 79.4; 134/38, 42; 430/329

[56] References Cited

U.S. PATENT DOCUMENTS

| | | | |
|---|---|---|---|
| 3,740,252 | 6/1973 | Chaikin | 156/668 X |
| 3,813,309 | 5/1974 | Bakos et al. | 156/668 |
| 4,601,972 | 7/1986 | Small, Jr. | 430/280 |

Primary Examiner—William A. Powell
Attorney, Agent, or Firm—Rodrick B. Anderson

[57] ABSTRACT

A bath (19) for stripping a cured electrophoretic resist coating (13) consists of a mixture comprising 0.2-50% of a fluoro-containing acetic acid, less than one percent corrosion inhibitors, and 50-99.8% of an amide solvent, preferably a cyclic amide. The amide solvent is preferably N-methylpyrrolidone, and the acid is preferably trifluoroacetic acid.

13 Claims, 1 Drawing Sheet

PHOTORESIST STRIPPING METHOD

TECHNICAL FIELD

This invention relates to solvents and, more particularly, to solvents used for stripping photoresist.

BACKGROUND OF THE INVENTION

One step in the fabrication of modern electronic devices is the formation of a conductor pattern over a substrate through photolithographic masking and etching. This step employs a photoresist coating over a metal layer which is selectively exposed to actinic light through a mask defining the desired conductor pattern. The photoresist film is developed so that it, in turn, constitutes a mask having openings defining the regions of the conductor to be etched.

One method of assembling integrated circuit devices is to support a number of them on a ceramic substrate to form an assembly known as a hybrid integrated circuit. It is sometimes advantageous to use an electrophoretic resist as the photoresist for patterning the metal conductor pattern on the substrate of a hybrid integrated circuit. An electrophoretic resist is typically an organic chemical, usually polymethylmethacrylate based, which is deposited on the metal coating by an electroplating process. Such resists offer advantages of fineline photolithographic definition as well as physical robustness. After masking and etching of the metal layer to form the conductor pattern, the electrophoretic mask must be removed using a photoresist stripping solvent. A commonly used stripping solvent for the electrophoretic resists is methoxy ethanol in two percent KOH, which is composed mostly of a glycolether component. Unfortunately, glycolether is a toxic teratogen, which constitutes both a hazardous liquid waste and a hazardous air pollutant.

Efforts at replacing glycolether-based solvents have proven difficult because cured electrophoretic resist is resistant to many solvents, and because many of the alternative solvents are difficult or disadvantageous to use. Certain alternatives, for example, require application at a high temperature which may cause harmful thermal stresses. Other alternatives damage polymers which may be part of a hybrid integrated circuit substrate. Still other alternatives have relatively low flash points which may make them dangerous to use.

There is therefore a long-felt need for safe and effective alternatives to glycolether-based solvents for stripping electrophoretic photoresists.

SUMMARY OF THE INVENTION

In accordance with the invention, a mixture of amide solvent, preferably a cyclic amide, and a fluoro-containing organic acid is used as a photoresist stripper. The mixture has toxicity, temperature, and other characteristics which make it attractive as an alternative to glycolether-based stripper solvents.

These and other features, advantages, and benefits of the invention will be better understood from a consideration of the following detailed description taken in conjunction with the accompanying drawing.

DETAILED DESCRIPTION

Figure 1:
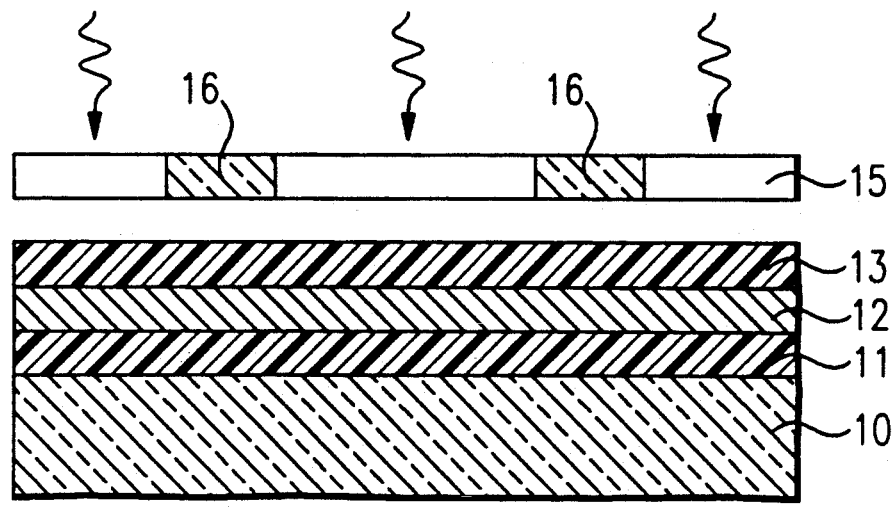
FIGS. 1, 2 and 3 are schematic views of part of a hybrid integrated circuit at successive stages of its fabrication.

The drawings are not intended to be to scale and have been somewhat distorted to aid in clarity of exposition. Referring now to FIG. 1, there is shown, for illustrative purposes, part of a hybrid integrated circuit comprising a ceramic substrate 10 having on one surface a polymer coating 11. A metal layer 12 overlies the polymer coating which in turn is covered by a layer 13 of photoresist. The photoresist 13 is illustratively an electrophoretic photoresist deposited by an electroplating process; it may, for example, be a polymethylmethacrylate-based polymer photoresist such as the photoresist known by the tradename Shipley XP8945, available from the Shipley Company, of Newton, Mass.

Situated over the photoresist coating 13 is a photolithographic mask 15 having opaque regions 16. Photoresist 13 is a type known as a negative photoresist, which means the portion not exposed to light is eventually removed through developing. Thus, it is intended that the transparent portions of the mask 15 through which light as shown by the arrows is transmitted corresponds in configuration to the desired configuration of the metal layer 12. Exposure to the light cures the portion of the photoresist layer 13 which makes it physically hard and resistant to the developing process.

Figure 2:
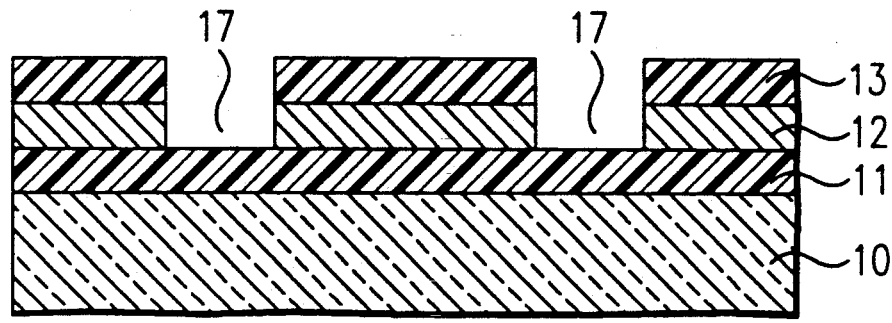

Referring to FIG. 2, the uncured portion of photoresist layer 13, that is, the portion not exposed to light, is removed through the process of developing the photoresist. A common developer comprises aqueous lactic acid. The developed layer 13 then constitutes a mask for permitting selective etching of the metal layer 12. That is, exposed portions of the metal layer are contacted in a known manner with a metal etchant and etched away, thereby producing openings 17 in the metal layer. After selective etching of the metal layer 12, the cured photoresist mask 13 is removed preferably in a bath as shown in FIG. 3.

Figure 3:
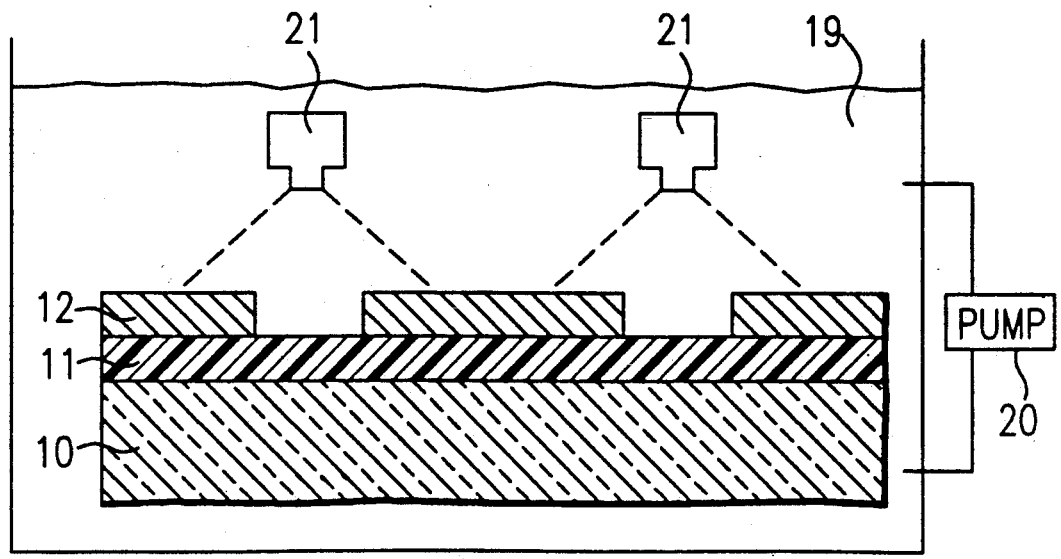

In accordance with the invention, the bath 19 of FIG. 3 consists of a mixture comprising 0.2–50% of a fluoro-containing organic acid, less than one percent corrosion inhibitors, and 50–99.8% of an amide solvent, preferably a cyclic amide. The fluid of the bath is circulated by a pump 20, and a plurality of nozzles 21 provide agitation to aid in the removal of the cured photoresist coating 13. Electrophoretic resists of the type that constitute resist coating 13 are quite robust, which is one of their advantages, but on the other hand, after cure are difficult to remove except with an effective solvent.

The amide solvent is preferably N-methylpyrrolidone, having a flashpoint of 187° F., although alternative solvents that could be used include dimethyl formamide, dimethyl acetamide, and N-cyclohexyl pyrrolidone, having respective flashpoints of 136° F., 158° F., and 293° F. The flashpoint is the temperature of ignition in the presence of a spark, and it is important that this temperature be sufficiently high to preclude accidental fires or explosions. All of the amide solvents mentioned above have a sufficiently high flashpoint for practical production line use.

The fluoro-containing acid is preferably trifluoroacetic acid, although trifluoromethane sulfonic acid could alternatively be used. The LD50 (lethal dose, fifty percent) of the trifluoroacetic acid is two hundred milligrams and for N-methylpyrrolidone is four thousand two hundred milligrams. The LD50 numbers for the other amide solvents mentioned above are also sufficiently high to constitute a usefully low toxicity. The relatively volatile fluoro-containing organic acids form complexes with the amides which substantially reduce the overall volatility of the acid-amide mixture. As a consequence, the mixture does not constitute a hazardous air pollutant. The corrosion inhibitor may be 3-amino-5-alkyl-1,2,4-triazole, mercaptobenzothiazole, mercaptobenzimidazole, and/or benzotriazole, which constitutes less than one percent of the mixture. All of these components are known corrosion inhibitors.

The polymer coating 11 that was used in my experiments was a triazine-based polymer of the type described in the U.S. Pat. No. 4,601,974 of Small, granted Jul. 22, 1986. It was important that the photoresist stripper not do serious damage to the polymer coating 11. Considering this and the various performance requirements described above, I determined that a preferred form of the invention consisted of a mixture of trifluoroacetic acid, N-methylpyrrolidone, and less than one percent of a corrosion inhibitor comprising 2-mercaptobenzimidazole. The effectiveness of the various stripping mixtures in removing a photoresist coating of the type described above having thicknesses of fifteen to thirty microns is given by Table I.

TABLE I

| Temperature | TFA/NMP | Stripping Time (Minutes) |
|---|---|---|
| 33° C. | 1.5% | 2.5 |
| 43° C. | 1.5% | 1.0 |
| 20° C. | 5% | 1.5 |
| 42° C. | 5% | 0.5 |
| 45° C. | 3% | 0.5 |

The first column in Table I gives the temperature at which stripping took place. The column TFA/NMP designates the ratio of trifluoroacetic acid to N-methylpyrrolidone. One can appreciate that the process is somewhat temperature dependent, but that harmfully high temperatures are not required, and that all of the ratios that were tried resulted in a usefully short stripping time in minutes.

The corrosion inhibiting effects of the preferred 2-mercaptobenzimidazole (2-MBI) was analyzed by immersing in a bath containing the 2-MBI a strip of metal one square centimeter in area covered with a one mil thick layer of plated copper. Table II shows the effectiveness of 2-MBI in inhibiting corrosion.

TABLE II

| 2-MBI (%) | 0 | 0.05 | 0.1 | 0.2 | 0.3 |
|---|---|---|---|---|---|
| (Copper Concentration) PPM 1 hr. | 22 | 5.3 | 4.6 | 5.2 | 5.6 |
| (Copper Concentration) PPM 3 hr. | 52 | 14 | 14 | 16 | 19 |
| Complete Dissolution Time hr. | 7 | 20 | 28 | 24 | 24 |

The Table shows that as little as 0.1% or 0.2% of 2-MBI is quite effective in significantly reducing the copper concentration due to exposure to the bath due to inhibition of corrosion in both. For example, at 0.1% 2-MBI, after one hour in the bath, the copper concentration in the bath was only 4.6 parts per million (PPM).

The invention was used to strip a particular kind of electrophoretic photoresist that is used on a product made by AT&T, but various other photoresists are sufficiently chemically close to this photoresist that the stripping action of the solvent described would be effective. Various other embodiments and modifications may be made by those skilled in the art without departing from the spirit and scope of the invention.

I claim:

1. A method for making an electronic device comprising the steps of:

coating part of a substrate with a photoresist coating;

selectively exposing the photoresist to actinic light;

developing the photoresist coating in accordance with said selective exposure to actinic light;

using the developed photoresist coating as a mask to permit selective operation on part of the underlying substrate;

and removing the developed photoresist coating by exposing the coating to a mixture comprising 0.2–50% of a fluoro-containing organic acid, less than one percent corrosion inhibitors, and 50–99.8% of an amide solvent.

2. The method of claim 1 wherein:

the photoresist is an electrophoretic photoresist.

3. The method of claim 1 wherein:

the substrate comprises a polymer coating on a solid body, and a metal layer coated on the polymer coating;

and the photoresist is coated on the metal layer.

4. The method of claim 3 wherein:

the step of selectively operating on the substrate comprises the step of selectively etching said metal coating.

5. The method of claim 1 wherein:

the fluoro-containing organic acid comprises trifluoroacetic acid.

6. The method of claim 1 wherein:

the amide solvent is selected from the group consisting of dimethyl formamide, dimethyl acetamide, N-methylpyrrolidone, and N-cyclohexyl pyrrolidone.

7. The method of claim 6 wherein:

the amide solvent comprises N-methylpyrrolidone.

8. The method of claim 7 wherein:

the mixture consists of 0.2–50% trifluoroacetic acid, less than one percent of a corrosion inhibitor, and 50–99.8% of N-methylpyrrolidone.

9. The method of claim 8 wherein:

the corrosion inhibitor is 2-mercaptobenzimidazole.

10. The method of claim 9 wherein:

the photoresist is an electrophoretic photoresist.

11. The method of claim 10 wherein:

the electrophoretic photoresist is coated on a metal layer.

12. The method of claim 11 wherein:

the metal layer is coated on a polymer layer.

13. The method of claim 12 wherein:

the polymer layer is a triazine-based polymer and the photoresist is a polymethylmethacrylate-based polymer.

* * * * *